(12) United States Patent
Aksamit et al.

(10) Patent No.: US 7,770,048 B2
(45) Date of Patent: Aug. 3, 2010

(54) CALCULATING AND INDICATING A NUMBER OF TIMES A DEVICE IS INSERTED INTO A SLOT

(75) Inventors: Slavek P. Aksamit, Austin, TX (US);
David D. Chudy, Raleigh, NC (US);
Cristian Medina, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 11/750,046

(22) Filed: May 17, 2007

(65) Prior Publication Data
US 2008/0285703 A1 Nov. 20, 2008

(51) Int. Cl.
*G06F 1/04* (2006.01)
(52) U.S. Cl. .................. 713/502; 377/15
(58) Field of Classification Search ........... 713/502; 377/15
See application file for complete search history.

(56) References Cited

U.S. PATENT DOCUMENTS

| 4,964,144 | A | * | 10/1990 | Uchida et al. ............... 377/15 |
| 5,552,776 | A | * | 9/1996 | Wade et al. ................ 340/5.74 |
| 5,897,663 | A | | 4/1999 | Stancil |
| 5,991,355 | A | * | 11/1999 | Dahlke ..................... 377/15 |
| 6,292,903 | B1 | | 9/2001 | Coteus et al. |
| 6,625,702 | B2 | | 9/2003 | Rentschler et al. |
| 6,662,119 | B1 | * | 12/2003 | Mitchell .................... 702/34 |
| 6,745,147 | B2 | * | 6/2004 | Ahrens et al. ............... 702/127 |
| 6,883,125 | B2 | * | 4/2005 | Abbondanzio et al. ...... 714/100 |
| 6,892,159 | B2 | | 5/2005 | Weiss et al. |
| 6,944,708 | B2 | | 9/2005 | Frame et al. |
| 7,085,884 | B2 | | 8/2006 | Torrey et al. |
| 7,172,358 | B1 | * | 2/2007 | Rudelius et al. ............ 401/195 |
| 7,321,313 | B1 | * | 1/2008 | Inlow ....................... 340/654 |
| 2002/0035364 | A1 | * | 3/2002 | Schoenman et al. ......... 606/45 |
| 2004/0143703 | A1 | | 7/2004 | Emberty et al. |

FOREIGN PATENT DOCUMENTS

EP 0994406 A2 4/2000
JP 11259178 A 9/1999

* cited by examiner

*Primary Examiner*—Nitin C Patel
(74) *Attorney, Agent, or Firm*—Edward J. Lenart; Cynthia G. Seal; Biggers & Ohanian LLP.

(57) ABSTRACT

An apparatus is disclosed. The apparatus comprises a device and a counter system coupled thereto. The counter system provides an indication of a number of times the device is inserted into a slot. Through the use of the device disclosed above, a history and a number of insertions of a particular device within a system can be known and therefore it can be determined if the integrity of the device is threatened.

20 Claims, 2 Drawing Sheets

CALCULATING AND INDICATING A NUMBER OF TIMES A DEVICE IS INSERTED INTO A SLOT

FIELD OF INVENTION

The present invention relates to a device and in particular to methods and systems for providing an indication of the integrity of the device.

BACKGROUND OF THE INVENTION

Electronic systems such as computing systems include a plurality of components which are plugged into sockets on a printed circuit board and the like. For example, one or more dual inline memory modules (DIMMs), for example, are plugged into slots within a computing system. Oftentimes, these modules are moved frequently from slot to slot within the system as memory requirements of the system change. Frequent insertion and removal of these modules from a slot within a computing system often impacts the structural, electrical, and functional integrity of the device. Accordingly, the modules can fail within a computing system without warning or indication.

Thus, what is needed is a system and method that addresses the above-identified issues. The present invention addresses such a need.

SUMMARY OF THE INVENTION

An apparatus is disclosed. The apparatus comprises a device and a counter system coupled to the device. The counter system provides an indication of a number of times the device is inserted into one or more slots.

Through the use of the device disclosed above, a history and a number of insertions of a particular apparatus within a system can be known and therefore it can be determined if the integrity of the apparatus is threatened.

DETAILED DESCRIPTION OF THE INVENTION

The present invention relates to a device and in particular to methods and systems for providing an indication of the integrity of the device. The following description is presented to enable one having ordinary skill in the art to make and use the embodiment and is provided in the context of a patent application and the generic principles and features described herein will be apparent to those skilled in the art. Thus, the present embodiment is not intended to be limited to the embodiments shown, but is to be accorded the widest scope consistent with the principles and features described herein.

Figure 1:
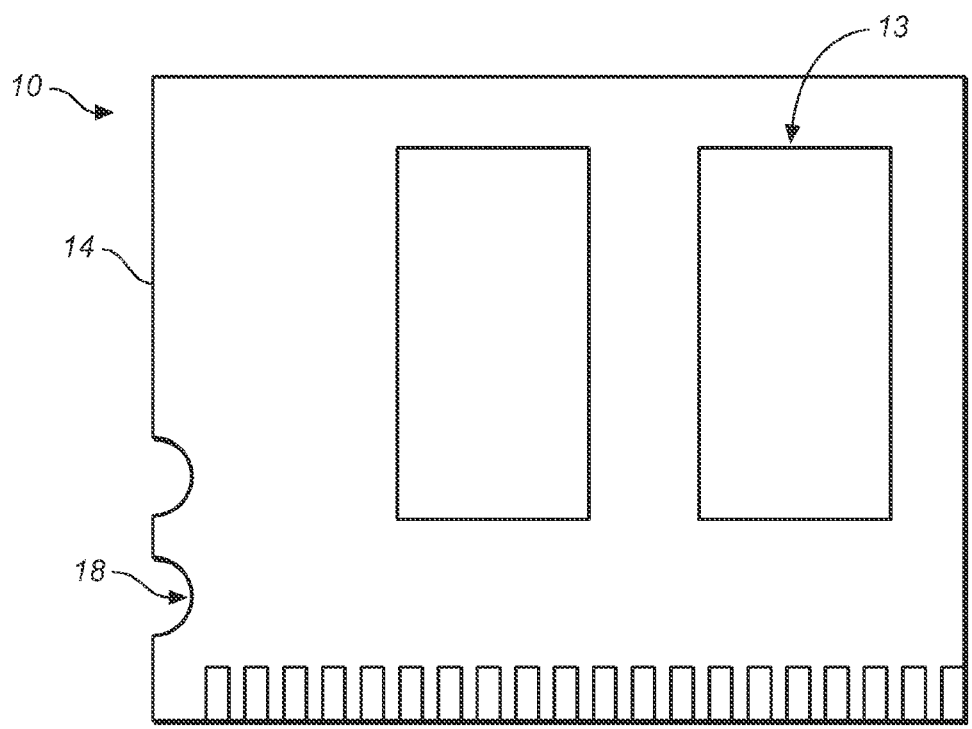
FIG. 1 shows a partial front view of a DIMM.

FIG. 1 shows a partial front view of a dual inline memory module (DIMM) 10. As shown, DIMM 10 includes a plurality of memory components 13 and two inserts 18 along an edge 14 of the DIMM 10. The DIMM 10 may be inserted into one or more slots within a computing system.

It is known for some devices, such as DIMM 10, that the frequent removal and insertion a number of times into a slot will cause the device to become marginal. In some cases, the frequent removal and insertion of the DIMM 10 into a slot will cause the device to fail. The number of times that a device is inserted and removed from a slot prior to failure is referred to as the "plug life" of the device. The plug life of a DIMM, for example, could be as low as 25 insertions. Accordingly, it is desirable to have the ability to remove the DIMM 10 from the system before its functional integrity is threatened.

Figure 2:
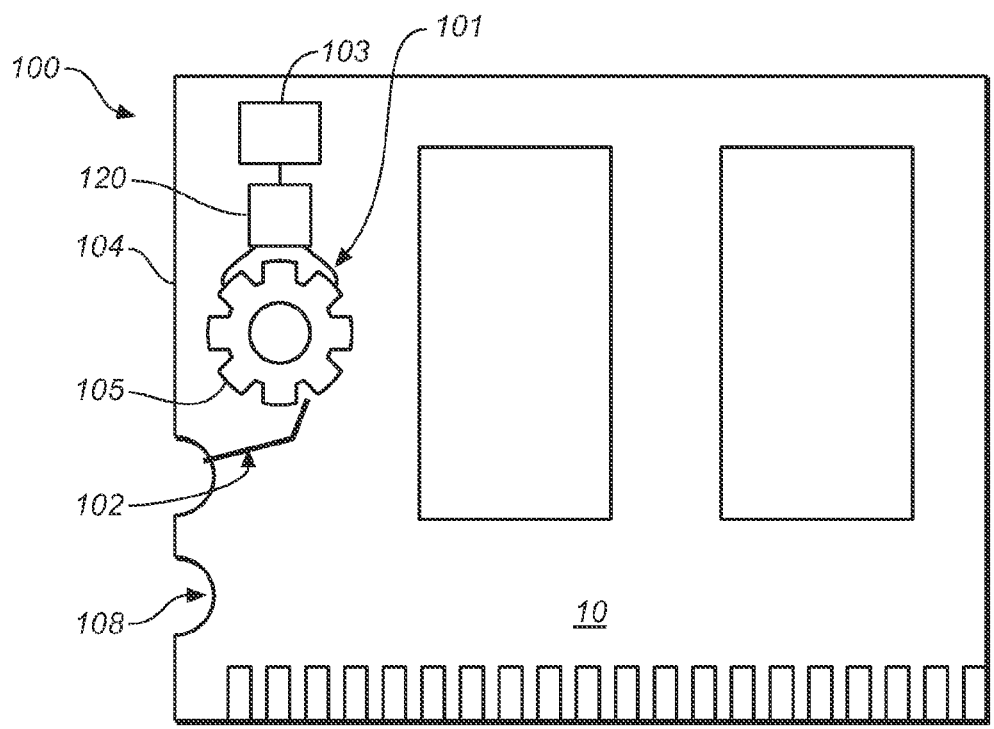
FIG. 2 shows a partial front view of a DIMM with an embodiment of the apparatus described by the present invention.

FIG. 2 shows a partial front view of an apparatus 100 having a DIMM 10 in accordance with the present invention. The apparatus 100 further includes a counter system, a gear 101, rod 102, a memory 103, and a microcontroller/counter 120) coupled to the DIMM 10, according to an embodiment. The apparatus 100 may comprise any device that is inserted into a slot such as, but not limited to, a dual inline memory module (DIMM), a daughter card, a blade, a peripheral component interface (PCI) card or any device.

The microcontroller/counter 120 is utilized to count the number of insertions of a particular device such that when the number of insertions exceeds a pre-determined plug life, the device is removed from service accordingly. As such, the microcontroller/counter provides an indication of the number of insertions of the device 10 within a slot 106.

As stated above, the apparatus 100 includes the memory 103. The DIMM 10 also includes a serial presence detect (SPD) memory module 103 that is an industry standard method for tracking properties and features of the DIMM 10. A specific address within the memory 103 contains the insertion count and is updated by the microcontroller/counter 120 when the device 10 is inserted into a slot and powered on.

FIG. 2 further shows that the gear 101 is located near an edge 104 of the device 10. Along the edge 104, two inserts 108 are disposed thereto, which couples and plugs the device 10 into a slot within a system. The gear 101 has a plurality of teeth 105, which any of the plurality of teeth 105 contacts the rod 102 at a given gear position.

The plurality of teeth 105 may comprise any number of teeth such that the gear 101 changes position when the device 10 inserts into a slot. For example, the plurality of teeth 105 comprises eight teeth. Thus, the gear 101 may take upon eight distinct positions.

As shown, the rod 102 rotates the gear 101 when the apparatus 100 is inserted into a slot. In the embodiment, the rod 102 may include a lever or any other suitable device that rotates the gear 101 when the apparatus 100 inserts into a slot.

A number of methods may be used to track the position of the gear 101. In a first embodiment, the gear 101 is implemented as a potentiometer wherein the resistance of the gear 101 changes upon the gear's 101 position.

In a second embodiment, a plurality of pads having electrical contacts is located in close proximity to the gear 101. The plurality of pads is located in a circle underneath the gear 101. Additionally, the gear 101 also contains an electrical contact that will close a circuit when the gear 101 passes over or contacts at least one of the plurality of pads.

Figure 3:
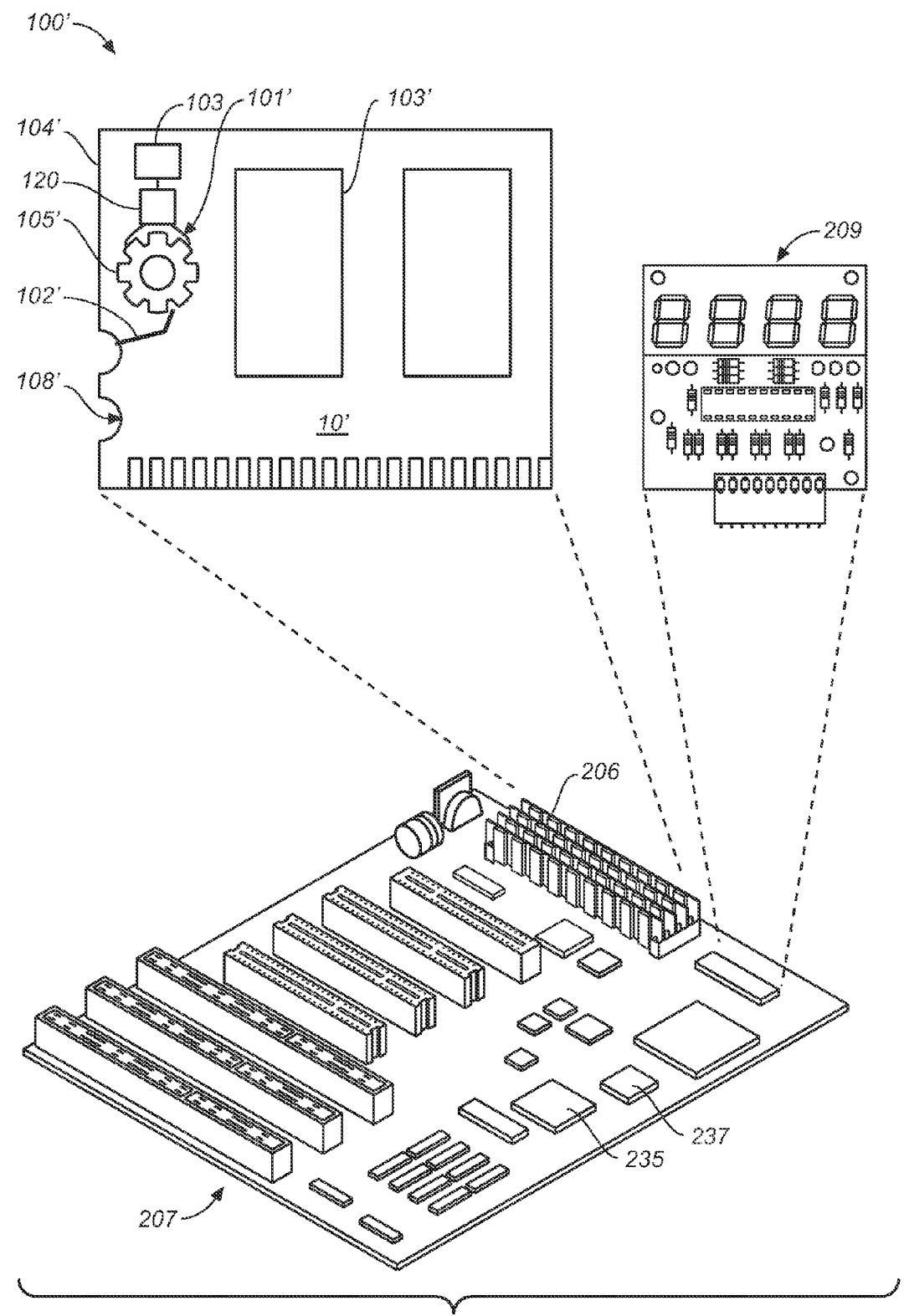
FIG. 3 shows the DIMM of FIG. 1 above a circuit board to further illustrate an operation of the apparatus.

FIG. 3 shows the device 10' above a printed circuit board 207 of a computing system to further illustrate the operation of the apparatus 100'. The printed circuit board includes, for example, a processor 235 and a logic circuitry 237 coupled to the processor 235. Furthermore, the printed circuit board 207 may have a plurality of slots 206 such that the apparatus 200 may be inserted in one or a plurality of slots 206 on the printed circuit board 207.

As before mentioned, the device 10' has two inserts 108'. Although two inserts 108 are shown in this embodiment, one of ordinary skill in the art readily recognize that the apparatus 100' may operate in a device with any number of inserts and that would be within the spirit and scope of the present invention.

Once the apparatus 100' is inserted into the slot 106', the gear 101' changes positions and the microcontroller/counter 120' provides an indication of the number of insertions into the memory 103'. For example, when the gear 101' changes position or rotates in response to when the apparatus 100' is inserted into the slot 106', the microcontroller/counter 120' in turn increments one position. The microcontroller/counter 120' also compares the previous position of the gear 101' and the current position of the gear 101' and computes the arithmetic difference there from. Once the difference is calculated, an arithmetic sum is computed by taking the difference and adding it to the last-stored insertion count in the memory 103'.

For example, if the last-stored insertion count is 14, the previous position of the gear 101' is position 6, and the current position of the gear 101' is 7, the microcontroller/counter 120' will change the insertion count to 15 by taking the arithmetic difference of positions 6 and 7 and the last-stored insertion count of 14 and computing the arithmetic sum of the two.

A computer system can query the contents of memory 103' and provide an indication to the user when a pre-determined amount (i.e. 25) is reached that may indicate that the device should be replaced. As previously mentioned, it is known that the functional integrity of a DIMM is affected when the number of insertions into one or more slots is greater than 25. One of ordinary skill in the art, however, readily recognizes that the total number of insertions could be any number and that would be within the spirit and scope of the present invention.

The microcontroller/counter 120' could also decrement one position every time the apparatus is inserted into a slot and that also would be within the spirit and scope of the present invention.

The counter system (101', 102', 103', 120' and 209) could also be utilized to provide an indication of the number of times the device 10' has been inserted in the slot 106' within a system when the system is in a power-off mode. For example, if the device 10' is inserted into the slot 106' while the computing system is turned off, the gear 101' nevertheless continues to change positions. Thus, when power is again provided to the system, the microcontroller/counter 120' computes the arithmetic difference of the current position and the previously-stored position and adds to or subtracts from the last-stored insertion count depending whether the microcontroller/counter 120' increments or decrements. As such, the number of insertions can be tracked when the apparatus 100' is inserted into the slot 106' within the system when the power is off and also when the power is again provided to the system.

First, a device 10' containing apparatus 100' is inserted into the slot 106'. Thereafter, once power is applied to slot 106', the microcontroller/counter 120' provides an indication of a number of times the device 10' is inserted into the slot 106' and updates the count on the memory 103'. In a first embodiment, the count contained within the memory 103' indicates the number of times device 10' has been inserted in a slot. In a second embodiment, the count indicates the number of times the device may be inserted before its integrity is compromised.

To describe a method for determining the integrity of a DIMM, first, the DIMM is inserted into a slot. Once the DIMM is inserted into the slot, a gear attached to the DIMM is rotated one position. The microcontroller/counter reads the total insertion count of the DIMM and the last stored position of the gear. Next, the microcontroller/counter computes the difference between the current position of the gear and the last stored position of the gear. Then, the total count is incremented by the computed difference. Finally, the new total count is stored back in a memory. In an embodiment, the memory may be readable by a system Basic Input/Output System (BIOS) or management firmware within a computing system to query the total count information within the memory through a system $I^2C$ interface and obtain a reading of the DIMM insertion history. Additionally, the system can provide error message warnings when the user of the DIMM may be marginal based upon a pre-determined number of DIMM insertions within the slot.

Thus, a method and system in accordance with the present invention is utilized to determine an insertion count and history of a device within a system. Accordingly, the insertion count and history of this device may be utilized to provide an indication of the integrity of the device, thereby allowing for replacement of the device prior to failure.

Although the present embodiment has been described in accordance with the embodiments shown, one having ordinary skill in the art will readily recognize that there could be variations to the embodiments and those variations would be within the spirit and scope of the present embodiment. Accordingly, many modifications may be made by one having ordinary skill in the art without departing from the spirit and scope of the appended claims.

What is claimed is:

1. An apparatus comprising:
  a device; and
  a counter system coupled to the device, wherein the counter system provides an indication of a number of times the device is inserted into one or more slots, the counter system comprising a microcontroller/counter and a gear, wherein the microcontroller/counter is configured to retrieve a last-stored gear position from a memory, calculate a first arithmetic difference between the last-stored gear position and a current gear position, and one of:
    calculate the arithmetic sum of the first arithmetic difference and a last-stored insertion count, and replace the last-stored insertion count with the arithmetic sum in the memory; or
    calculate a second arithmetic difference of the last-stored insertion count and the first arithmetic difference, and replace the last-stored insertion count with the second arithmetic difference in the memory.

2. The apparatus of claim 1, wherein the device has a pre-determined plug life.

3. The apparatus of claim 1, wherein the device is any of a dual inline memory module, a memory, a daughter card, a blade, and a peripheral component interconnect card.

4. The apparatus of claim 1, wherein the gear is fixed to the device, the gear changes a position when the device is inserted into the one or more slots and wherein the microcontroller/counter indicates a number of times the gear changes a position.

5. The apparatus of claim 1, wherein the counter system provides the indication of the number of times the device is inserted into the one or more slots when the apparatus is in a power-off mode.

6. A method comprising:
  receiving into one or more slots, an apparatus, the apparatus including a device and a counter system, the counter system comprising a gear and a microcontroller/counter; and providing, by the counter system, an indication of the number of times the apparatus is inserted into the one or more slots, including:
retrieving, by the microcontroller/counter, a last-stored gear position from a memory;
calculating, by the microcontroller/counter, a first arithmetic difference between the last-stored gear position and a current gear position; and one of:
calculating, by the microcontroller/counter, the arithmetic sum of the arithmetic difference and a last-stored insertion count, and replacing, by the microcontroller/counter in the memory, the last-stored insertion count with the arithmetic sum; or
calculating a second arithmetic difference of the last-stored insertion count and the first arithmetic difference, and replacing the last-stored insertion count with the second arithmetic difference in the memory.

7. The method of claim 6, wherein the apparatus has a pre-determined plug life.

8. The method of claim 6, wherein the gear is fixed to the apparatus, the gear changes a position when the device is inserted into the one or more slots and wherein the microcontroller/counter indicates a number of times the gear changes a position.

9. The method of claim 6, wherein the counter system provides the indication of the number of times the device is inserted into the one or more slots when the apparatus is in a power-off mode.

10. The method of claim 6, wherein the one or more slots is located on a printed circuit board and within a computing system.

11. An apparatus comprising:
a dual inline memory module including at least one insert, the at least one insert is insertable into one or more slots; and
a counter system coupled to the dual inline memory module, the counter system providing an indication of the number of times the dual inline memory module is inserted into the one or more slots, the counter system comprising a microcontroller/counter and a gear, wherein the microcontroller/counter is configured to retrieve a last-stored gear position from a memory, calculate a first arithmetic difference between the last-stored gear position and a current gear position, and one of:
calculate the arithmetic sum of the first arithmetic difference and a last-stored insertion count, and replace the last-stored insertion count with the arithmetic sum in the memory; or
calculate a second arithmetic difference of the last-stored insertion count and the first arithmetic difference, and replace the last-stored insertion count with the second arithmetic difference in the memory.

12. The apparatus of claim 11 wherein the gear is fixed to the dual inline memory module, the gear changes a position when the device is inserted into the one or more slots and wherein the microcontroller/counter indicates a number of times the gear changes a position.

13. The apparatus of claim 11, wherein the gear comprises a potentiometer, a resistance of the potentiometer changing in response to changes in the position of the gear.

14. The apparatus of claim 11, wherein the gear includes an electrical contact.

15. The apparatus of claim 14, wherein a plurality of small pads are located in proximity to the gear, wherein the electrical contact of the gear contacts at least one of the plurality of small pads in a each of a plurality of gear positions and closes a circuit when the gear passes over the at least one of the plurality of small pads.

16. A printed circuit board comprising:
a substrate;
at least one slot coupled to the substrate; and
an apparatus adapted to be coupled to the at least one slot, the apparatus comprising:
a device; and
a counter system coupled to the device, wherein the counter system provides an indication of a number of times the device is inserted into a slot, the counter system comprising a microcontroller/counter and a gear, wherein the microcontroller/counter is configured to retrieve a last-stored gear position from a memory, calculate a first arithmetic difference between the last-stored gear position and a current gear position, and one of:
calculate the arithmetic sum of the first arithmetic difference and a last-stored insertion count, and replace the last-stored insertion count with the arithmetic sum in the memory; or
calculate a second arithmetic difference of the last-stored insertion count and the first arithmetic difference, and replace the last-stored insertion count with the second arithmetic difference in the memory.

17. The printed circuit board of claim 16, wherein the device has a pre-determined plug life.

18. The printed circuit board of claim 16, wherein the device is any of a dual inline memory module, a memory, a daughter card, a blade, and a peripheral component interconnect card.

19. The printed circuit board of claim 16, wherein the gear is fixed to the device, the gear changes a position when the device is inserted into the at least one slot, the microcontroller/counter indicates a number of times the gear changes a position.

20. The printed circuit board of claim 16, wherein the counter system provides the indication of the number of times the device is inserted into the at least one slot when the apparatus is in a power-off mode.

* * * * *